United States Patent
Lee et al.

(10) Patent No.: US 11,280,558 B2
(45) Date of Patent: Mar. 22, 2022

(54) COMPOSITE SHEET, METHOD OF FABRICATING THE SAME, AND DISPLAY DEVICE COMPRISING THE SAME

(71) Applicant: Samsung Display Co., Ltd., Yoingin-si (KR)

(72) Inventors: Won Il Lee, Cheonan-si (KR); Min Seop Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/843,286

(22) Filed: Apr. 8, 2020

(65) Prior Publication Data
US 2020/0232722 A1    Jul. 23, 2020

Related U.S. Application Data

(63) Continuation of application No. 15/710,549, filed on Sep. 20, 2017, now Pat. No. 10,619,943.

(30) Foreign Application Priority Data

Nov. 25, 2016   (KR) .................... 10-2016-0158672

(51) Int. Cl.
*F28F 3/00* (2006.01)
*B23B 7/00* (2006.01)
(Continued)

(52) U.S. Cl.
CPC ................. *F28F 3/00* (2013.01); *B23P 19/04* (2013.01); *B32B 7/00* (2013.01); *F21V 11/16* (2013.01);
(Continued)

(58) Field of Classification Search
CPC .. F28F 3/00; F21V 29/70; F21V 11/16; B23P 19/04; B32B 7/00; G09F 13/04
See application file for complete search history.

(56) References Cited

U.S. PATENT DOCUMENTS 6,859,365 B2   2/2005   Koiwa et al.
7,170,014 B1   1/2007   Liang
(Continued)

FOREIGN PATENT DOCUMENTS

CN    1373413 A    10/2002
CN    1848206 A    10/2006
(Continued)

OTHER PUBLICATIONS

EPO Extended Search Report dated Apr. 19, 2018, for corresponding European Patent Application No. 17196807.6 (7 pages).
(Continued)

*Primary Examiner* — Zandra V Smith
*Assistant Examiner* — Andre C Stevenson
(74) *Attorney, Agent, or Firm* — Lewis Roca Rothgerber Christie LLP

(57) ABSTRACT

A composite sheet, including: a buffer sheet; and a heat dissipation sheet on one surface of the buffer sheet. One surface of the heat dissipation sheet facing the one surface of the buffer sheet may have a smaller area than the one surface of the buffer sheet. A display device includes a display panel and a composite sheet on one surface of the display panel.

12 Claims, 17 Drawing Sheets

(51) Int. Cl.
*H01L 51/52* (2006.01)
*F21V 29/70* (2015.01)
*B23P 19/04* (2006.01)
*F21V 11/16* (2006.01)
*G09F 13/04* (2006.01)
*B32B 7/00* (2019.01)

(52) U.S. Cl.
CPC .............. *F21V 29/70* (2015.01); *G09F 13/04* (2013.01); *H01L 51/52* (2013.01); *H01L 51/529* (2013.01); *B32B 2307/30* (2013.01); *G09F 13/0418* (2021.05)

(56) References Cited

U.S. PATENT DOCUMENTS

| | | | |
|---|---|---|---|
| 7,447,034 B2 | 11/2008 | Shin | |
| 9,680,126 B2 | 6/2017 | Kang et al. | |
| 9,883,579 B1* | 1/2018 | Huang | H05K 1/182 |
| 10,170,717 B2 | 1/2019 | Huang | |
| 10,312,358 B2 | 6/2019 | Ren et al. | |
| 2001/0014012 A1 | 8/2001 | Imazato | |
| 2007/0053205 A1* | 3/2007 | Jang | F21S 4/10 362/609 |
| 2009/0027859 A1 | 1/2009 | Giacoma | |
| 2011/0031883 A1 | 2/2011 | Kim et al. | |
| 2011/0180914 A1 | 7/2011 | Do et al. | |
| 2011/0240212 A1* | 10/2011 | McMahan | B29C 66/433 156/242 |
| 2014/0008041 A1 | 1/2014 | In et al. | |
| 2014/0140037 A1 | 5/2014 | Cho | |
| 2014/0342117 A1 | 11/2014 | Wang et al. | |
| 2014/0353623 A1 | 12/2014 | Yi et al. | |
| 2015/0270438 A1 | 9/2015 | Sugihara et al. | |
| 2016/0027718 A1 | 1/2016 | Park et al. | |
| 2016/0211431 A1* | 7/2016 | Yang | H01L 31/049 |
| 2017/0294528 A1 | 10/2017 | Ren et al. | |
| 2018/0114933 A1* | 4/2018 | Huang | H01L 29/78606 |

FOREIGN PATENT DOCUMENTS

| | | |
|---|---|---|
| CN | 1882238 A | 12/2006 |
| CN | 101996569 A | 3/2011 |
| CN | 104218057 A | 12/2014 |
| CN | 104900713 | 9/2015 |
| CN | 105098089 A | 11/2015 |
| CN | 105551384 A | 5/2016 |
| CN | 205284011 U | 6/2016 |
| KR | 10-2011-0050985 A | 5/2011 |
| KR | 10-2014-0006378 A | 1/2014 |
| KR | 10-2014-0063227 A | 5/2014 |
| KR | 10-2014-0141330 A | 12/2014 |
| TW | M481436 U | 7/2014 |
| WO | WO 2014/007454 A1 | 1/2014 |
| WO | 2014/038439 A1 | 3/2014 |
| WO | WO 2015/065117 A1 | 5/2015 |
| WO | WO 2015/147071 A1 | 10/2015 |
| WO | 2016/054545 A1 | 4/2016 |

OTHER PUBLICATIONS

Chinese Office Action dated Dec. 1, 2020, issued in corresponding Chinese Patent Application No. 201711179982.5 (8 pages).
Office action issued in corresponding Chinese Application No. 201711179982.5, dated Dec. 28, 2021, 7 pages.

\* cited by examiner

COMPOSITE SHEET, METHOD OF FABRICATING THE SAME, AND DISPLAY DEVICE COMPRISING THE SAME

CROSS-REFERENCE TO RELATED APPLICATIONS

This application is a continuation of U.S. patent application Ser. No. 15/710,549, filed on Sep. 20, 2017, which claims priority to and the benefit of Korean Patent Application No. 10-2016-0158672, filed on Nov. 25, 2016, the entire content of which is incorporated herein by reference for all purposes as if fully set forth herein.

BACKGROUND

1. Field

Embodiments of the present disclosure relate to a composite sheet, a method of fabricating the same, and a display device including the same.

2. Description of the Related Art

The importance of display devices has been increased with the development of multimedia. Accordingly, various types (or kinds) of display devices, such as a liquid crystal display (LCD), an organic light-emitting display (OLED), and the like, have been used.

Among them, an organic light-emitting display device displays an image using an organic light-emitting element that emits light by recombination of electrons and holes. The organic light-emitting display device has features of having a high response speed, high luminance and a wide viewing angle and being driven at low power consumption.

SUMMARY

Aspects of embodiments of the present disclosure provide a composite sheet having a heat dissipation sheet in which wrinkles caused by plastic deformation are reduced (e.g., prevented), a method of fabricating the composite sheet, and a display device including the composite sheet.

However, aspects of embodiments of the present disclosure are not restricted to the embodiments set forth herein. The above and other aspects of embodiments of the present disclosure will become more apparent to one of ordinary skill in the art to which the present disclosure pertains by referencing the detailed description of the present disclosure.

An exemplary embodiment of the present disclosure provides a composite sheet, including: a buffer sheet; and a heat dissipation sheet disposed on one surface of the buffer sheet. One surface of the heat dissipation sheet facing the one surface of the buffer sheet may have a smaller area than the one surface of the buffer sheet.

An exemplary embodiment of the present disclosure also provides a display device, including: a display panel; and a composite sheet including a buffer sheet disposed on one surface of the display panel and a heat dissipation sheet disposed on one surface of the buffer sheet. The heat dissipation sheet may expose at least a portion of the one surface of the buffer sheet.

An exemplary embodiment of the present disclosure provides a method of fabricating a composite sheet, including: preparing a metal layer; removing at least a portion of the metal layer to form a heat dissipation sheet; disposing the heat dissipation sheet on a buffer member; and removing at least a portion of the buffer member to form a buffer sheet including one surface facing the heat dissipation sheet. The one surface of the heat dissipation sheet facing one surface of the buffer sheet may have a smaller area than the one surface of the buffer sheet.

BRIEF DESCRIPTION OF THE DRAWINGS

The above and other aspects and features of the present disclosure will become more apparent by describing in more detail exemplary embodiments thereof with reference to the attached drawings, in which.

DETAILED DESCRIPTION

Figure 1:
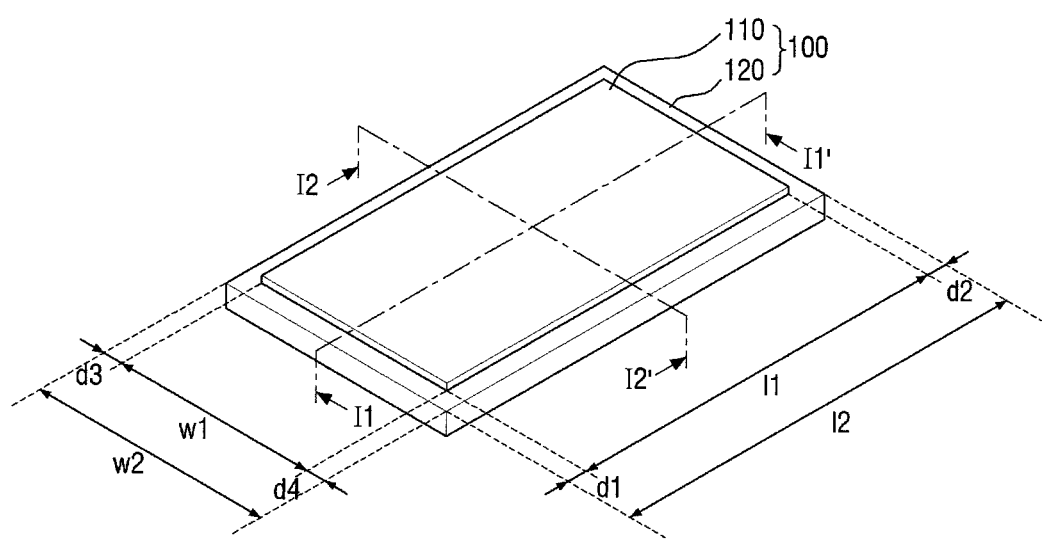
FIG. 1 is a perspective view showing a composite sheet according to an embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, certain structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements throughout.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to cross-sectional illustrations that may be schematic illustrations of idealized exemplary embodiments and/or intermediate structures. As such, variations from the shapes of the illustrations as a result, for example, of manufacturing techniques and/or tolerances, may be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, in many embodiments, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described with reference to the attached drawings.

Figure 2:
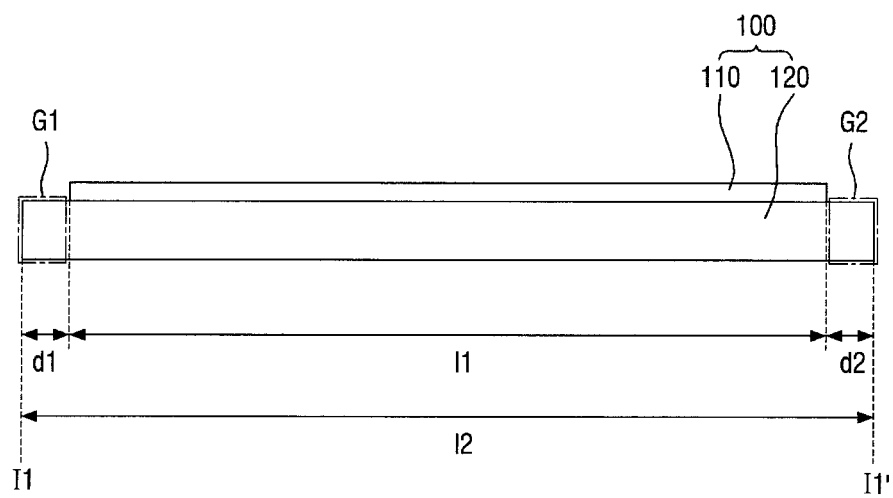
FIG. 2 is a cross-sectional view taken along the line I1-I1' of FIG. 1.
Figure 3:
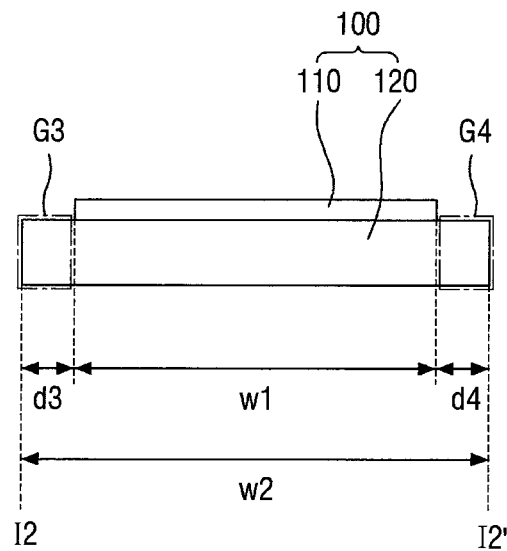
FIG. 3 is a cross-sectional view taken along the line I2-I2' of FIG. 1.

FIG. 1 is a perspective view showing a composite sheet according to an embodiment of the present disclosure. FIG. 2 is a cross-sectional view taken along the line I1-I1' of FIG. 1. FIG. 3 is a cross-sectional view taken along the line I2-I2' of FIG. 1.

The composite sheet 100 according to an embodiment of the present disclosure may include a heat dissipation sheet 110 and a buffer sheet 120.

The heat dissipation sheet 110 may be disposed on the buffer sheet 120. The heat dissipation sheet 110 may discharge (e.g., dissipate) the heat generated from a display panel, which will be described later, to the outside. In an exemplary embodiment, the heat-radiation sheet may contain copper (Cu). Further, the heat-radiation sheet may contain a metal having excellent thermal conductivity, such as silver (Ag), a copper alloy, and/or aluminum (Al), in addition to copper (Cu), and may also contain a carbon-based material, such as graphite and/or graphene.

The buffer sheet 120 may absorb an impact applied from the outside to improve impact resistance. The buffer sheet 120 may contain a material that can absorb an impact. In an exemplary embodiment, the buffer sheet 120 may contain an elastic polymer resin, such as, for example, polyethylene, polycarbonate, polyurethane, and/or polypropylene. Further, the buffer sheet 120 may be formed of a sponge foamed with a rubber liquid, a urethane-based material, or an acrylic material.

In an exemplary embodiment, each of the heat dissipation sheet and the buffer sheet may be a plate-shaped sheet, and may have a rectangular shape. However, the present disclosure is not limited thereto, and the shape of each of the heat dissipation sheet and the buffer sheet may be changed depending on the shape and size of a display panel to be combined with the composite sheet 100.

The area of the heat dissipation sheet 110 (e.g., the total surface area of a surface of the heat dissipation sheet 110 facing one surface of the buffer sheet 120) may be smaller than the area of the buffer sheet 120 (e.g., the total surface area of the one surface of the buffer sheet 120). This will be described in more detail with reference to FIGS. 1-2.

Each of the heat dissipation sheet 110 and the buffer sheet 120 may be a rectangular plate-shaped sheet having a short side and a long side longer than the short side. Here, the length l1 of the long side of the heat dissipation sheet 110 may be shorter than the length l2 of the long side of the buffer sheet 120. Further, the length w1 of the short side of the heat dissipation sheet 110 may be shorter than the length w2 of the short side of the buffer sheet 120.

Describing embodiments in more detail with reference to FIGS. 2-3, the buffer sheet 120 may include an exposure area. The exposure area does not overlap the heat dissipation sheet 110, and is defined as an area exposed to the outside. The exposure area may include first to fourth regions G1 to G2.

The first region G1 may be located at one side of the buffer sheet 120 in the long side direction thereof, and the second region G2 may be located at the other side of the buffer sheet 120 in the long side direction thereof. The third region G3 may be located at one side of the buffer sheet 120 in the short side direction thereof, and the fourth region G4 may be located at the other side of the buffer sheet 120 in the short side direction thereof.

The first region G1 may have a first width d1, and the second region G2 may have a second width d2. In some embodiments, the sum of the first width d1 and the second width d2 is equal to the value obtained by subtracting the length l1 of the long side of the heat dissipation sheet 110 from the length l2 of the long side of the buffer sheet 120. The third region G3 may have a third width d3, and the fourth region G4 may have a fourth width d4. The sum of the third width d3 and the fourth width d4 is equal to the value obtained by subtracting the length w1 of the short side of the heat dissipation sheet 110 from the length w2 of the short side of the buffer sheet 120.

In an exemplary embodiment, the first width d1 and the second width d2 are equal (e.g., substantially equal) to each other. For example, each of the first width d1 and the second width d2 may be about 0.3 mm to 0.5 mm. Further, in some embodiments, the third width d3 and the fourth width d4 are equal (e.g., substantially equal) to each other. For example, each of the third width d3 and the fourth width d4 may be about 0.3 mm to 0.5 mm. Moreover, in some embodiments, all of the first to fourth widths d1 to d4 may be equal (e.g., substantially equal) to each other.

Figure 4:
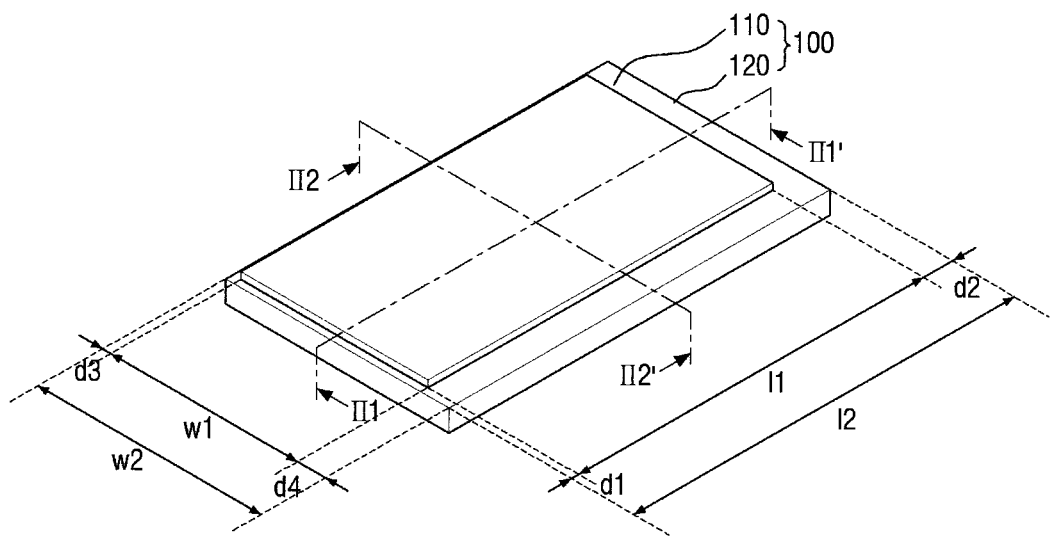
FIG. 4 is a perspective view showing a composite sheet according to another embodiment of the present disclosure.
Figure 5:
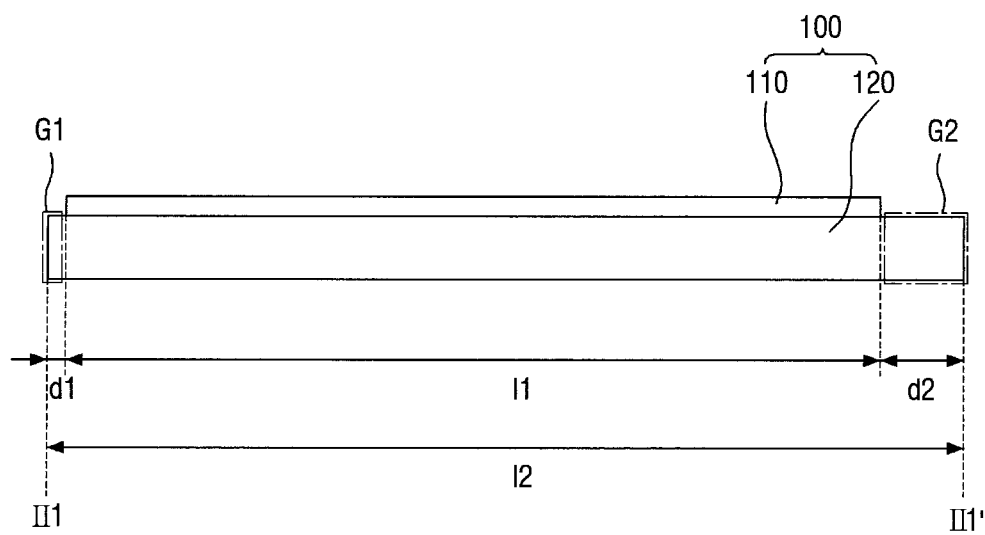
FIG. 5 is a cross-sectional view taken along the line II1-II1' of FIG. 4.
Figure 6:
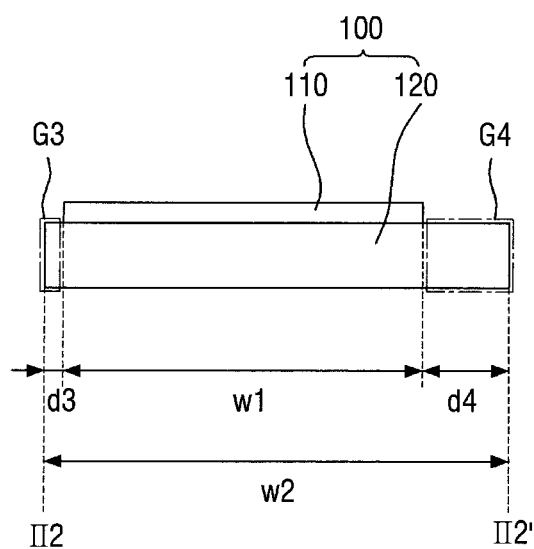
FIG. 6 is a cross-sectional view taken along the line II2-II2' of FIG. 4.

FIG. 4 is a perspective view showing a composite sheet according to another embodiment of the present disclosure. FIG. 5 is a cross-sectional view taken along the line II1-II1' of FIG. 4. FIG. 6 is a cross-sectional view taken along the line II2-II2' of FIG. 4. Descriptions of features that are the same or substantially the same as those described with respect to FIGS. 1-3 are not necessary here.

Referring to FIGS. 4-6, the first width d1 and the second width d2 may be different from each other. In an exemplary embodiment, the first width d1 may be shorter than the second width d2. Further, the third width d3 and the fourth width d4 may be different from each other. In an exemplary embodiment, the third width d3 may be shorter than the fourth width d4. Meanwhile, although it is shown in FIGS. 4-6 that the first width d1 is shorter than the second width d2, and the third width d3 is shorter than the fourth width d4, the present disclosure is not limited thereto.

For example, in an exemplary embodiment, the first width d1 may be longer than the second width d2, and the third width d3 may be longer than the fourth width d4. In another exemplary embodiment, the first width d1 and the second width d2 may be different from each other, but the third width d3 and the fourth width d4 may be equal (e.g., substantially equal) to each other. In still another exemplary embodiment, the first width d1 and the second width d2 may be equal (e.g., substantially equal) to each other, but the third width d3 and the fourth width d4 may be different from each other.

Meanwhile, although it is shown in FIGS. 1-6 that all of the first to fourth widths d1 to d4 are not 0, the present disclosure is not limited thereto as long as the area of the heat dissipation sheet 110 is smaller than the area of the buffer sheet 120.

Hereinafter, another embodiment of the composite sheet 100 will be described. However, this embodiment will be described with reference to the cross-sectional view taken along the line I1-I1' of FIG. 1.

Figure 7:
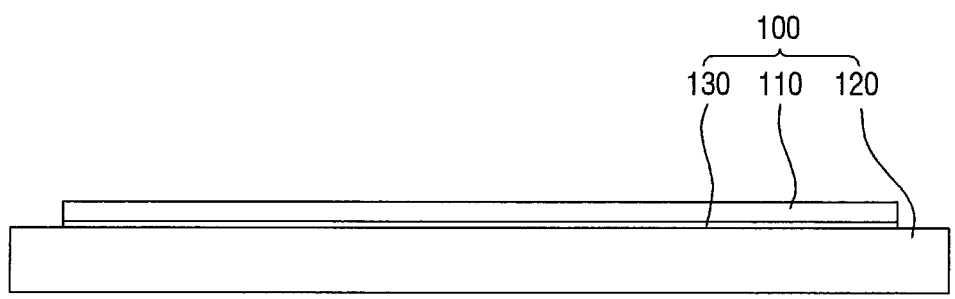
FIG. 7 is a cross-sectional view showing the composite sheet of FIG. 1 provided with an adhesive layer.

FIG. 7 is a cross-sectional view showing the composite sheet of FIG. 1 provided with an adhesive layer.

Referring to FIG. 7, an adhesive layer 130 may be disposed between the heat dissipation sheet 110 and the buffer sheet 120. The adhesive layer 130 may attach the heat dissipation sheet 110 and the buffer sheet 120 to each other. In an exemplary embodiment, the adhesive layer 130 may include an optical polymer film (OCA) or an optical transparent adhesive resin (OCR).

The shape and size of the adhesive layer 130 are not particularly limited as long as the heat dissipation sheet 110 and the buffer sheet 120 are attached to each other by the adhesive layer 130. In an exemplary embodiment, the adhesive layer 130 may have the same or substantially the same shape and size as the heat dissipation sheet 110.

Meanwhile, the adhesive layer 130 may be omitted. If the adhesive layer 130 is omitted, one side of the heat dissipation sheet 110 may have an adhesive force to contact the buffer sheet 120.

Figure 8:
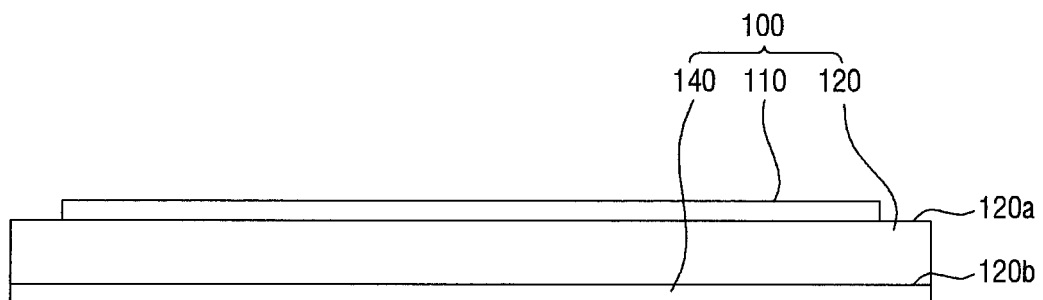
FIG. 8 is a cross-sectional view showing the composite sheet of FIG. 1 provided with a light-blocking sheet.

FIG. 8 is a cross-sectional view showing the composite sheet of FIG. 1 provided with a light-blocking sheet.

Referring to FIG. 8, the buffer sheet 120 may include one surface 120a to be in contact with the heat dissipation sheet 110 and the other surface 120b opposite thereto. A light-blocking sheet 140 may be in contact with the other surface 120b of the buffer sheet 120.

The light-blocking sheet 140 may be disposed between a display panel, which will be described later, and the buffer sheet 120, so as to block the light incident on the display panel.

The light-blocking sheet 140 may contain polyethylene terephthalate (PET). The shape and size of the light-blocking sheet 140 are not particularly limited. In an exemplary embodiment, the light-blocking sheet 140 may have the same or substantially the same shape and size as the buffer sheet 120.

Figure 9:
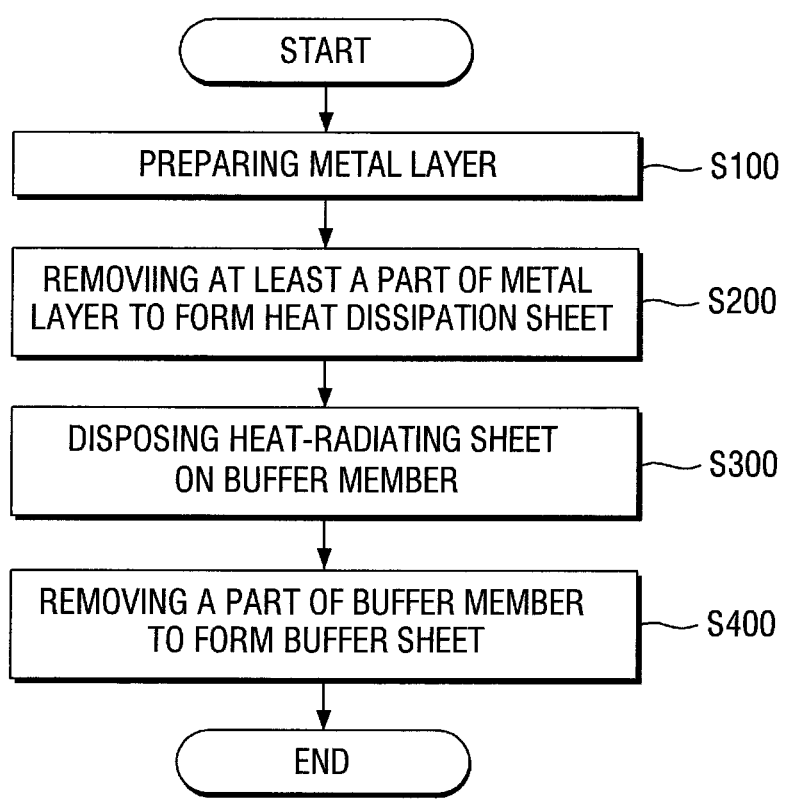
FIG. 9 is a flowchart illustrating a method of forming a composite sheet according to an embodiment of the present disclosure.

FIG. 9 is a flowchart illustrating a method of forming a composite sheet according to an embodiment of the present disclosure. FIGS. 10-14 are cross-sectional views illustrating a method of forming a composite sheet according to an embodiment of the present disclosure. Meanwhile, in FIGS. 10-14, the method of forming a composite sheet will be described with reference to the cross-sectional view taken along the line I1-I1' of FIG. 1, for the convenience of explanation.

Figure 10:
FIGS. 10-14 are cross-sectional views illustrating a method of forming a composite sheet according to an embodiment of the present disclosure.
Figure 11:
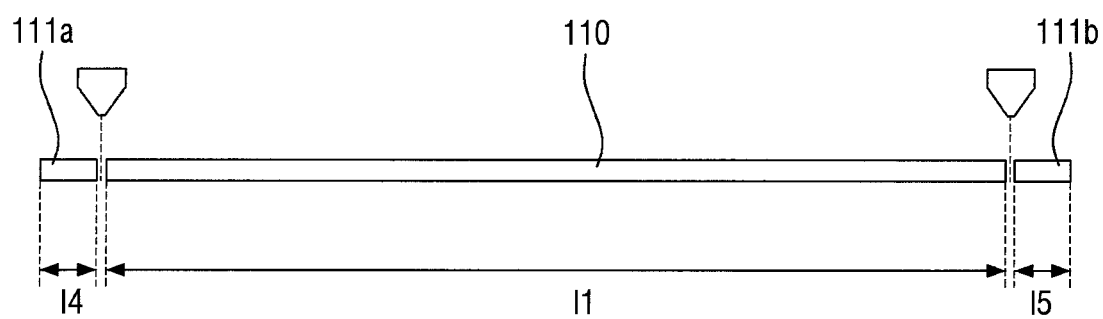

Referring to FIGS. 9-10, a metal layer 111 is prepared (S100). In an exemplary embodiment, the metal layer 111 may contain copper (Cu). The metal layer 111 may contain a metal having excellent thermal conductivity, such as silver (Ag), a copper alloy, and/or aluminum (Al), in addition to copper (Cu), and may also contain a carbon-based material, such as graphite and/or graphene.

Next, referring to FIGS. 9-10, at least a portion (e.g., a part) of the metal layer 111 is removed to form a heat dissipation sheet 110 (S200). For example, a first removal region 111a located at one side of the metal layer 111 in the long side direction thereof and a second removal region 111b located at the other side of the metal layer 111, opposite to the one side thereof, in the long side direction thereof may be removed. Here, the first removal region 111a and the second removal region 111b may be removed by a punching process. The length 14 of the first removal region 111a may be equal (e.g., substantially equal) to or different from the length 15 of the second removal region 111b.

Further, in the case where at least a portion (e.g., a part) of the metal layer 111 is removed to form the heat dissipation sheet 110 having a set (e.g., predetermined) long side length 11, both the first removal region 111a and the second removal region 111b may not be necessarily removed by a punching process. In some embodiments, the heat dissipation sheet 110 may be formed by removing only one of both sides of the metal layer 111 through a punching process.

Figure 12:

Next, referring to FIG. 9 and FIG. 12, the heat dissipation sheet 110 is disposed on a buffer member 121 (S300). The buffer member 121 may contain a material that can absorb an impact. In an exemplary embodiment, the buffer member 121 may contain an elastic polymer resin, such as polyethylene, polycarbonate, polyurethane, or polypropylene. Further, the buffer member 121 may be formed of a sponge foamed with a rubber liquid, a urethane-based material, or an acrylic material.

The length 16 of the long side of the buffer member 121 is longer than the length 11 of the long side of the heat dissipation sheet 110. In an exemplary embodiment, the heat dissipation sheet 110 and the buffer member 121 may be attached to each other through an adhesive layer.

Figure 13:
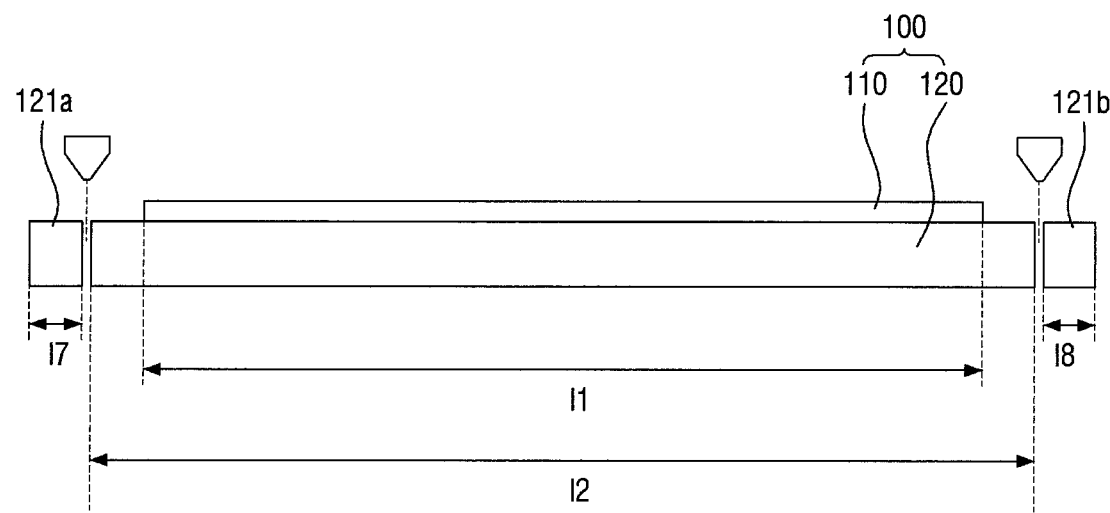
Figure 14:
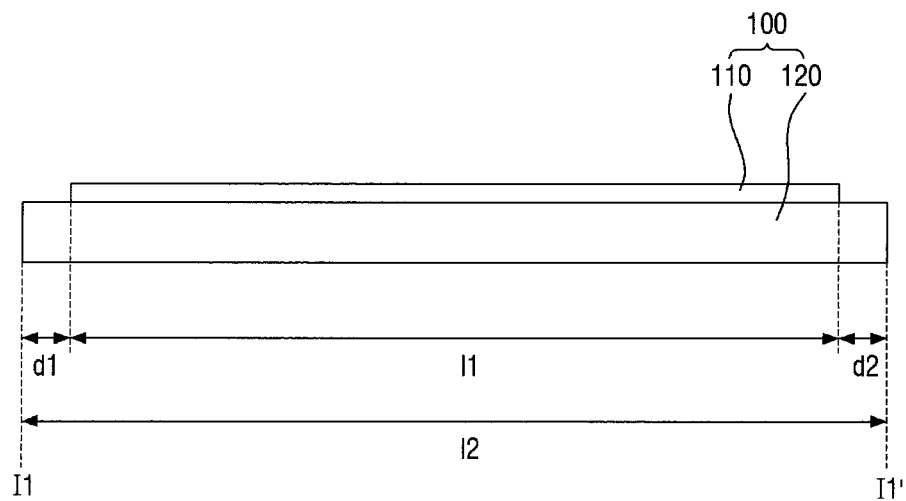

Next, referring to FIG. 9, FIG. 13 and FIG. 14, at least a portion (e.g., a part) of the buffer member 121 is removed to form a buffer sheet 120 (S400). For example, a third removal region 121a located at one side of the buffer member 121 and a fourth removal region 121b located at the other side of the buffer member 121, opposite to the one side thereof, may be removed. Here, the third removal region 121a and the fourth removal region 121b do not overlap the heat dissipation sheet 110.

The length 17 of the third removal region 121a may be equal (e.g., substantially equal) to or different from the length 18 of the fourth removal region 121b. In an exemplary embodiment, the third removal region 121a and the fourth removal region 121b may be removed by a punching process. In some embodiments, the punching process may not be performed with respect to the heat dissipation sheet 110, but may be performed with respect to the third and the fourth removal regions 121a and 121b which do not overlap the heat dissipation sheet 110.

The length 17 of the long side of the third removal area 121a and the length 18 of the long side of the fourth removal area 121b are not particularly limited as long as the length 12 of the long side of the buffer sheet 120 is longer than the length 11 of the long side of the heat dissipation sheet 110. Further, both the third removal area 121a and the fourth removal region 121b may not be necessarily removed by a punching process, and only one removal region of the two removal regions may also be removed by the punching process. However, even in this case, it is satisfied that the length 12 of the long side of the buffer sheet 120 is longer that the length 11 of the long side of the heat dissipation sheet 110.

Here, in an exemplary embodiment, the difference between the length 12 of the long side of the buffer sheet 120 and the length 11 of the long side of the heat dissipation sheet 110 may be about 0.3 mm to 0.5 mm.

In some embodiments of the method of fabricating a composite sheet, the metal layer is formed on the buffer member, and neither the buffer member nor the metal layer is punched at once.

When the metal layer 111 is disposed on the buffer member 121 and both the metal layer 111 and the buffer member 121 are punched at once, pressure is applied to the buffer member 121 having lower density than the metal layer 111 during the punching to allow the buffer member 121 to be deformed, and thus the metal layer 111 may be plastically deformed. As a result, in the heat dissipation sheet 110 including the plastically deformed metal layer 111, appearance defects such as wrinkles may occur in the plastically deformed portion of the metal layer 111.

In contrast, in the method of fabricating a composite sheet according to an embodiment of the present disclosure, a portion (e.g., a part) of the metal layer 111 is removed to form the heat dissipation sheet 110, the heat dissipation sheet 110 is disposed on the buffer member 121, and then at least a portion (e.g., a part) of a region of the buffer membrane 121, the region not overlapping the heat dissipation sheet 110, is removed, thereby forming the buffer sheet 120.

In some embodiments, since the punching process is performed with respect to the third removal region 121a and fourth removal region 121b of the buffer membrane 121, which are regions not overlapping the heat dissipation sheet 110, it is possible to prevent or reduce the plastic deformation of the heat dissipation sheet 110 due to the difference in density between the heat dissipation sheet 110 and the buffer member 121. Therefore, the composite sheet 100 according to an embodiment of the present disclosure can improve appearance defects such as wrinkles.

Meanwhile, the larger the area of the heat dissipation sheet 110, the more the heat-radiating efficiency can be improved. For example, when the punching process is performed in a state where the heat dissipation sheet 110 and the buffer sheet 120 completely overlap each other, there is a high probability of appearance defects occurring. Therefore, considering the heat-radiating efficiency by the heat radiation sheet 100 and the probability of occurrence of the appearance defects, the length of at least one region of the first to fourth regions (G1 to G4, refer to FIGS. 2-3) may be about 0.3 mm to 0.5 mm.

Figure 15:
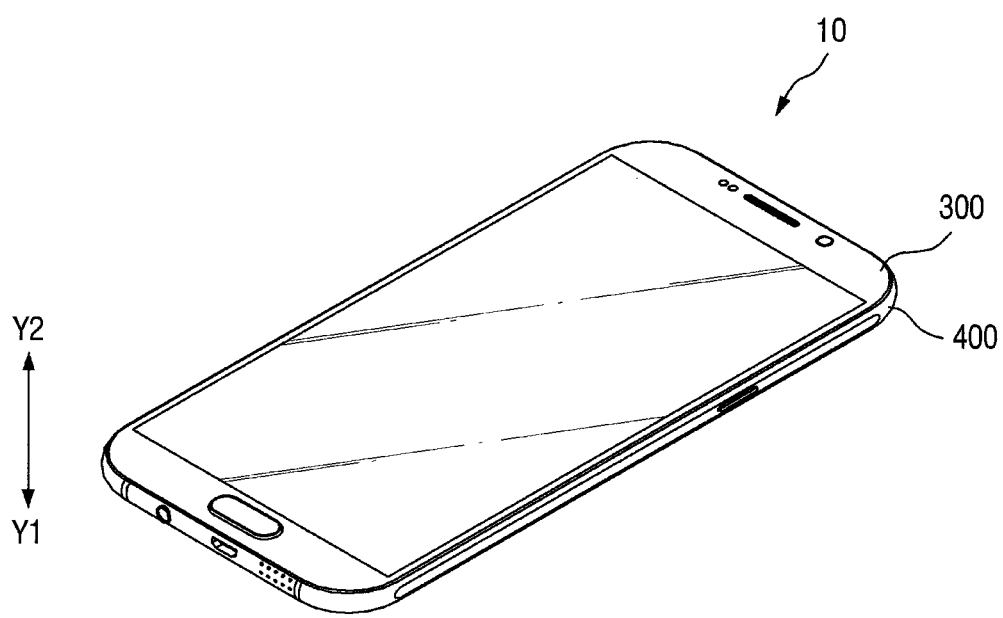
FIG. 15 is a perspective view showing an example of a display device to which the composite sheet according to an embodiment of the present disclosure is applied.
Figure 16:
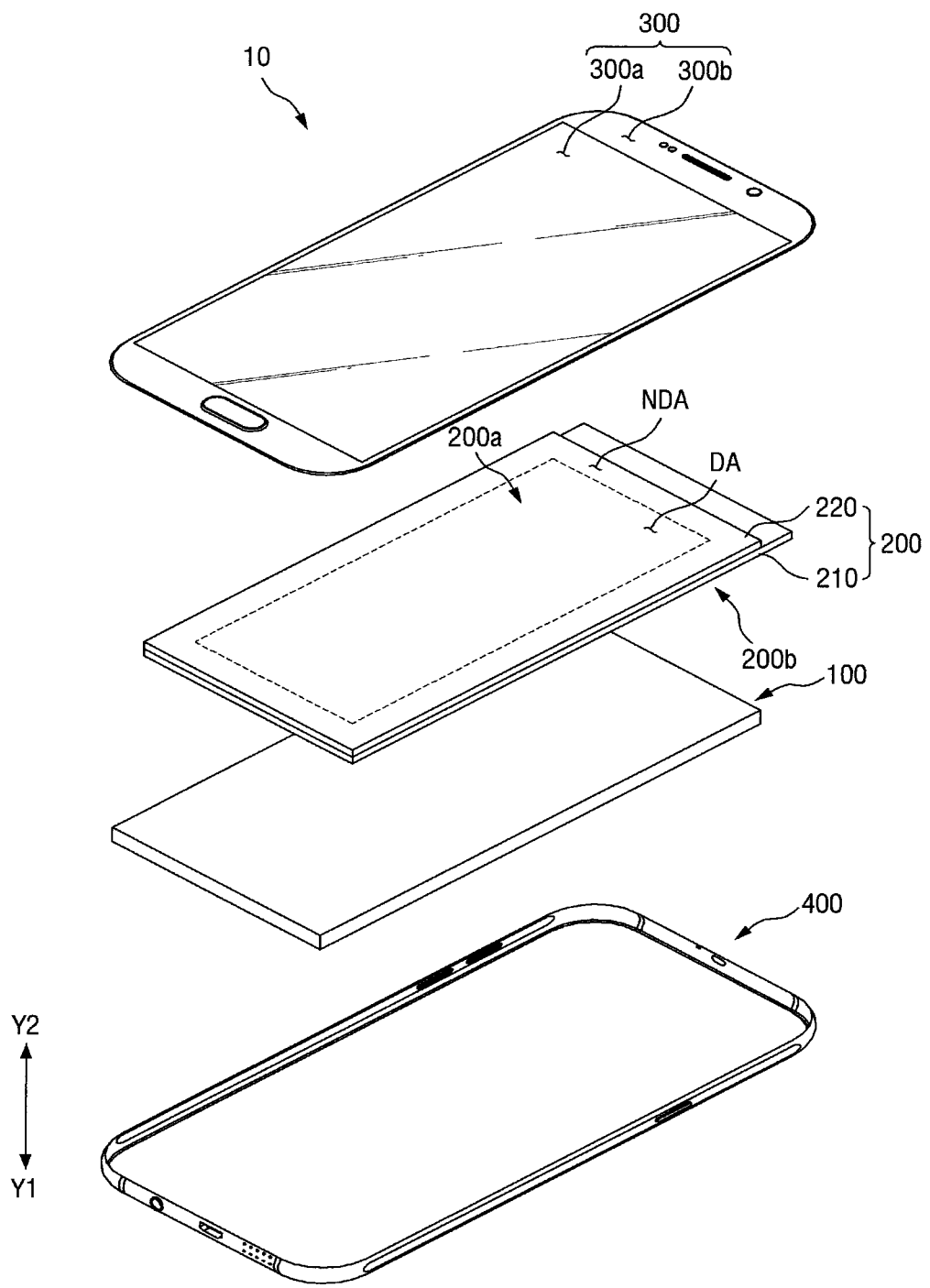
FIG. 16 is an exploded perspective view of the display device shown in FIG. 15.
Figure 17:
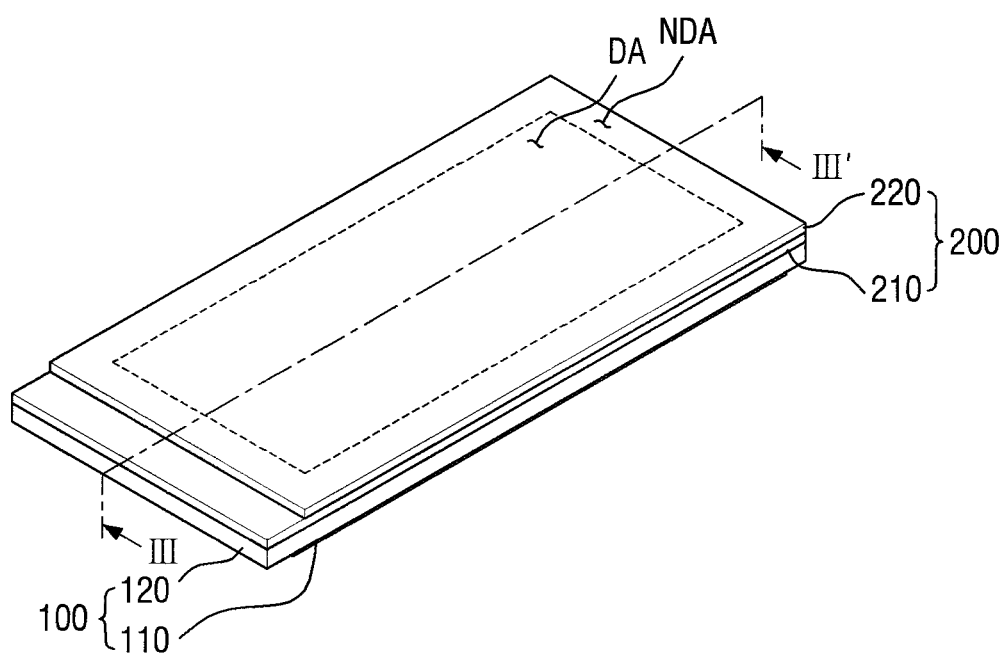
FIGS. 17-18 are perspective views showing an example of the composite sheet and display panel shown in FIG. 15.
Figure 18:
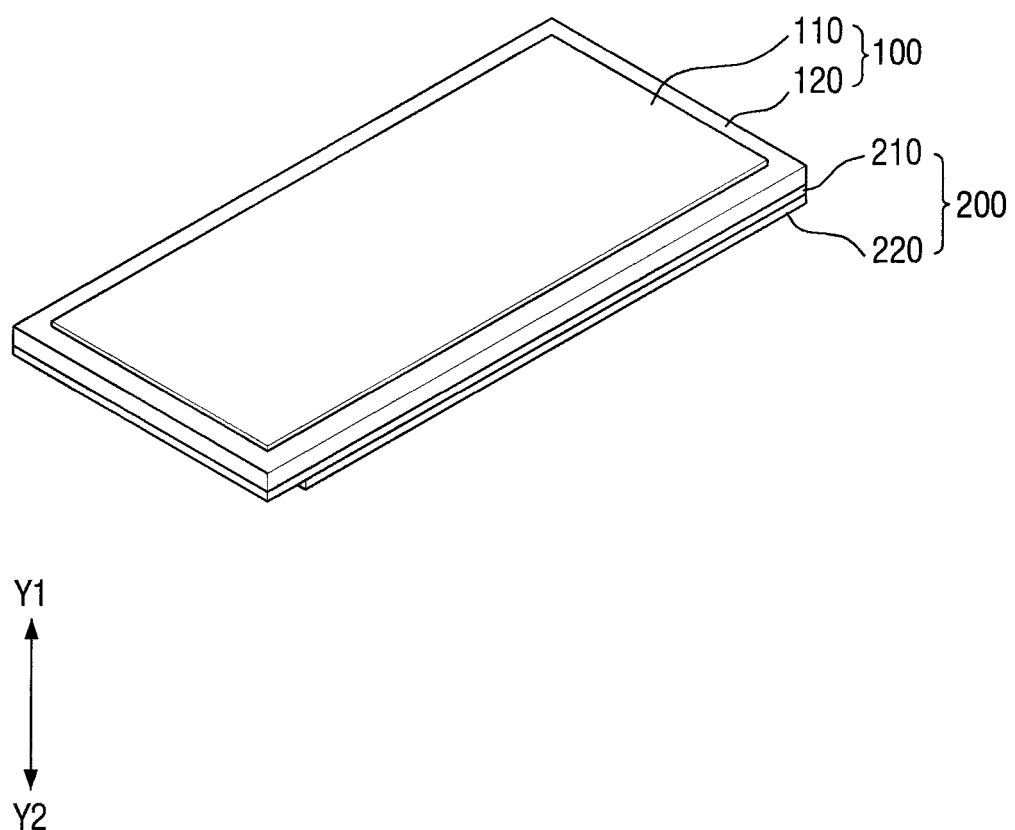
Figure 19:
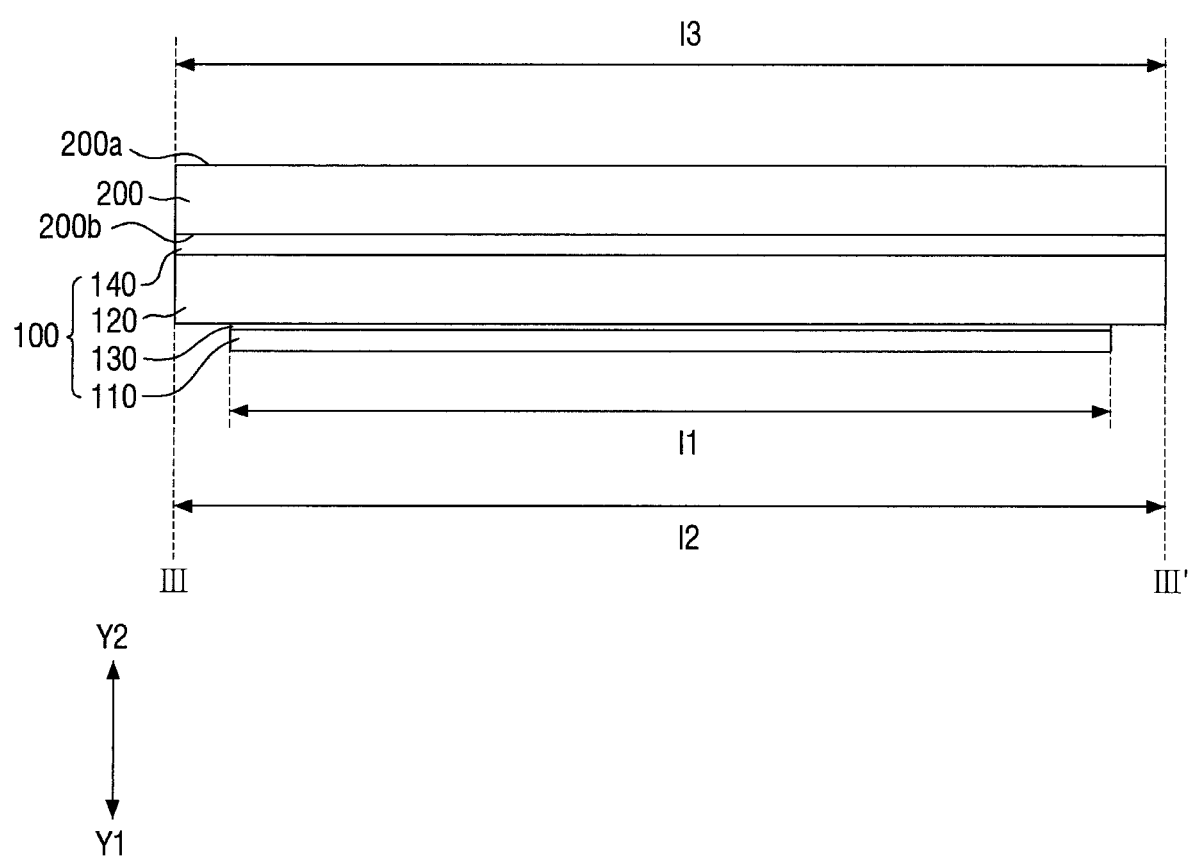
FIG. 19 is a cross-sectional view taken along the line of FIG. 17.

FIG. 15 is a perspective view showing an example of a display device to which the composite sheet according to an embodiment of the present disclosure is applied. FIG. 16 is an exploded perspective view of the display device shown in FIG. 15. FIGS. 17-18 are perspective views showing an example of the composite sheet and display panel shown in FIG. 15. FIG. 19 is a cross-sectional view taken along the line of FIG. 17.

Illustratively, the display device 10 according to an embodiment of the present disclosure may be a portable terminal such as a smart phone. In another exemplary embodiment, the display device 10 may be a tablet PC, a personal digital assistant (PDA), a portable multimedia player (PMP), or the like, or may be applied to a personal computer, a notebook computer, a camera, or the like.

Referring to FIGS. 15-16, the display device 10 may include a composite sheet 100, a display panel 200, a window member 300, and a rear case 400.

The display panel 200 is a panel for displaying an image. In an exemplary embodiment, the display panel 200 may be an organic light emitting diode (OLED) panel. In this case, the display panel 200 may include a substrate 210, a sealing layer 220 disposed on the substrate 210, and a plurality of organic light emitting elements disposed between the substrate 210 and the sealing layer 220. In some embodiments, the display panel 200 may be a liquid crystal display (LCD) panel, a light emitting diode (LED) panel, an electrophoretic display panel, or the like. In this specification, a case where the display panel 200 is an OLED panel will be described as an example.

The display panel 200 includes a display area DA and a non-display area NDA. The display area DA may be defined as an area for displaying an image. The non-display area NDA is located at the outer periphery of the display area DA and may be defined as an area surrounding the display area DA. Hereinafter, the surface on which the display area DA is located is defined as an upper surface 200a of the display panel 200, and the surface opposite to the upper surface 200a is defined as a back surface 200b of the display panel 200.

The window member 300 may disposed on the display panel 200. Here, the disposition direction of the window member 300 refers to the Y2 direction in FIG. 16. In other words, the window member 300 may be disposed on the upper surface 200a of the display panel 200.

The window member 300 may cover the upper surface 200a of the display panel 200. The window member 300 may include a cover window made of a transparent material, such as glass, sapphire, and/or plastic. Further, the window member 300 may further include an adhesive member disposed between the cover window and the display panel 200 to attach the cover window and the display panel 200 to each other. Here, in an exemplary embodiment, the adhesive member may be formed of a material including an acrylic resin that is cured by ultraviolet rays or heat.

The window member 300 may include a light-transmitting area 300a and a light-blocking area 300b. The light-transmitting area 300a may be defined as an area corresponding to the display area DA of the display panel 200. The light-blocking area 300b may be defined as an area corresponding to the non-display area NDA of the display panel 200.

Referring to 17 to 19, the composite sheet 100 may be disposed on the back surface 200b of the display panel 200. The composite sheet 100 may protect the display panel 200 from an external impact. Accordingly, the display panel 200 may have impact resistance due to an external impact.

The composite sheet 100 includes a heat dissipation sheet 110 and a buffer sheet 120. Hereinafter, the surface that is in contact with the back surface 200b of the display panel 200 is defined as one surface of the composite sheet 100, and the surface opposite thereto is defined as the other surface of the composite sheet 100.

The buffer sheet 120 is disposed on the back surface 200b of the display panel 200, and absorbs at least a portion (e.g., a part) of an external impact provided to the display panel 200 and the window member 300, thereby dispersing the external impact. In an exemplary embodiment, the length l2 of the long side of the buffer sheet 120 may be equal (e.g., substantially equal) to the length l3 of the long side of the display panel 200. However, the present disclosure is not limited thereto, and, in an exemplary embodiment, the length l2 of the long side of the buffer sheet 120 may be longer than the length l3 of the long side of the display panel 200.

The heat dissipation sheet 110 is disposed on the buffer sheet 120. Thus, the buffer sheet 120 may be disposed between the heat dissipation sheet 110 and the display panel 200. The heat dissipation sheet 110 may discharge the heat generated from the display panel to the outside. The length l1 of the long side of the heat dissipation sheet 110 is shorter than the length l2 of the long side of the buffer sheet 120.

Here, the composite sheet 100 is formed by the fabrication method having been described with reference to FIGS. 9-14. The display device 10 according to an embodiment of the present disclosure includes the composite sheet 100 improved in appearance defects such as wrinkles. Meanwhile, the sizes of the heat dissipation sheet 110 and the buffer sheet 120 are not particularly limited as long as the heat dissipation sheet 110 includes regions exposed to the outside without overlapping the buffer sheet 120.

The composite sheet 100 may further include an adhesive layer 130 and a light-blocking sheet 140.

The adhesive layer 130 may be disposed between the heat dissipation sheet 110 and the buffer sheet 120. The adhesive layer 130 may attach the heat dissipation sheet 110 and the buffer sheet 120 to each other. The light-blocking sheet 140 may be disposed between the display panel 200 and the buffer sheet 120. The light-blocking sheet 140 may block the light incident on the display panel 200. In an exemplary embodiment, the light-blocking sheet 140 may have the same or substantially the same shape and size as the buffer sheet 120.

The rear case 400 may contain and support the composite sheet 100 and the display panel 200. In an exemplary embodiment, the rear case 400 may be a box-shaped case having a plate-like bottom surface and side walls extending therefrom. The rear case 400 may be formed of a material having high rigidity.

In an exemplary embodiment, the rear case may be formed of a metal material such as stainless steel, aluminum, aluminum alloy, nickel alloy, magnesium and/or magnesium alloy, and/or a plastic material. The rear case 400 may include a bracket. The bracket may support the display panel 200 and the composite sheet 100. One side of the bracket may be in contact (e.g., direct physical contact) with the composite sheet 100.

Figure 20:
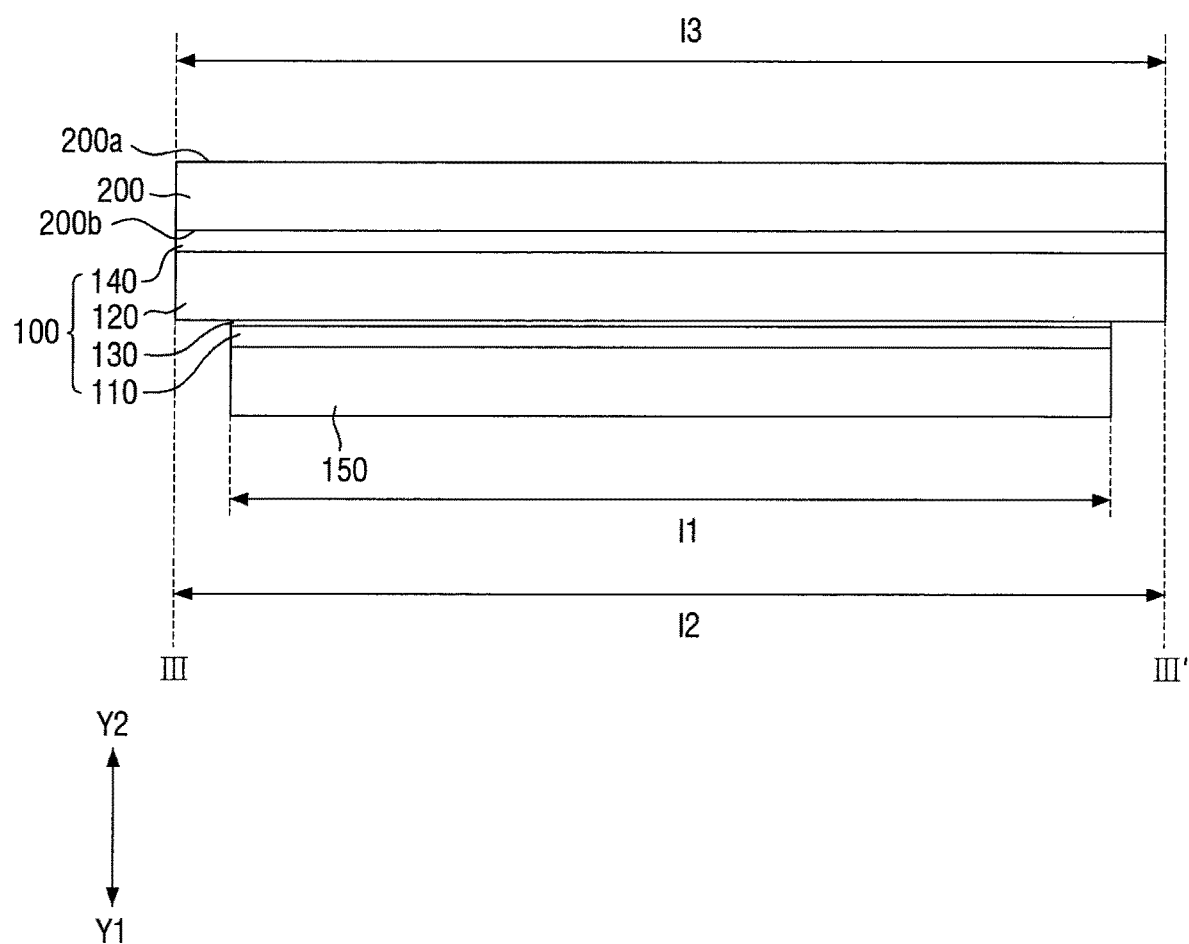
FIGS. 20-22 are cross-sectional views showing other examples of the composite sheet and display panel shown in FIG. 15.
Figure 21:
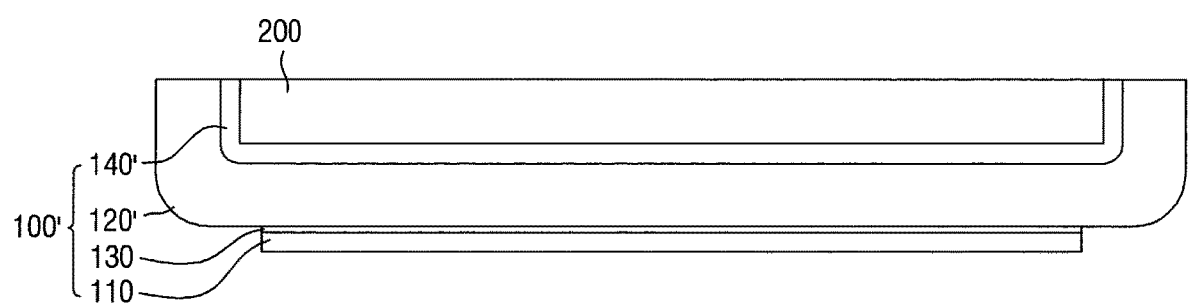
Figure 22:
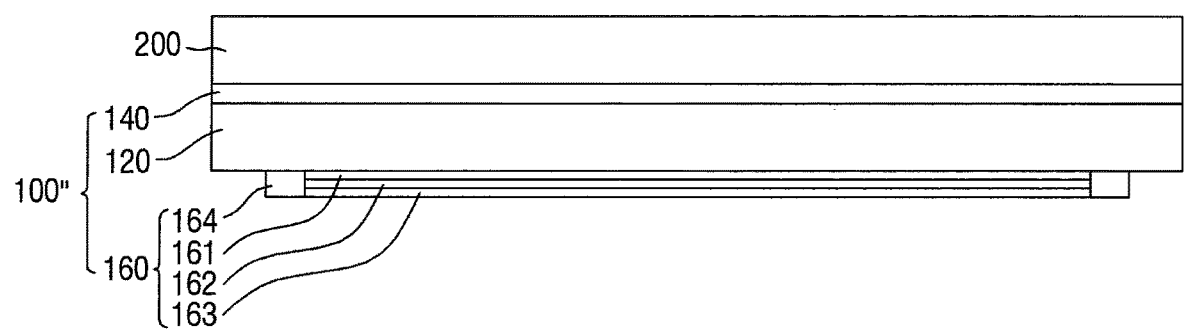

FIGS. 20-22 are cross-sectional views showing other examples of the composite sheet and display panel shown in FIG. 15.

Referring to FIG. 20, the display device may further include a radiation member 150. In an exemplary embodiment, the radiation member 150 may be disposed on the heat dissipation sheet 110. The radiation member 150 may block electromagnetic interference generated from a printed circuit board (PCB, refer to FIG. 16). Further, the radiation member 150 may discharge the heat generated from the display panel 200 to the outside together with the heat dissipation sheet 110.

The radiation member 150 may overlap the heat dissipation sheet 110. Accordingly, the length of the long side of the radiation member 150 may be equal to (e.g., substantially equal to) the length of the long side of the heat dissipation sheet 110. However, the present disclosure is not limited thereto, and the radiating member 150 may have a smaller area (a smaller total area) than the heat dissipation sheet 110 on a plane (e.g., in a plane substantially parallel to the heat dissipation sheet 110). In this case, the radiation member 150 may expose at least a portion (e.g., a part) of the heat dissipation sheet 110 to the outside.

In an exemplary embodiment, the radiation member 150 may include a conductive sheet. The conductive sheet may contain copper (Cu), nickel (Ni), and/or ferrite. The conductive sheet is not particularly limited as long as it can block electromagnetic waves.

Referring to FIG. 21, a composite sheet 100' may include a heat dissipation sheet 110, an adhesive layer 130, a buffer sheet 120', and a light-blocking sheet 140'.

Here, each of the buffer sheet 120 'and the light-blocking sheet 140' may include a bent region. For example, the buffer sheet 120' and the light shielding sheet 140' may be bent to cover one side surface of the display panel 200 and the other side surface opposite thereto. Consequently, the durability of the side surfaces of the display panel 200 can be improved.

Unlike what is shown in the drawings, the buffer sheet 120 'and the light-blocking sheet 140' may cover only one side surface of the display panel 200. In addition, the buffer sheet 120' and the light-blocking sheet 140' may not overlap all of the side surfaces of the display panel 200. In this case, a portion (e.g., a part) of the side surface of the display panel 200 may be exposed to the outside. Further, the light-blocking sheet 140' may be omitted.

Referring to FIG. 22, a composite sheet 100" may include a heat dissipation sheet 160, a buffer sheet 120, and a light-blocking sheet 140. The heat dissipation sheet 160 may include a heat-radiating adhesive layer 161, a graphite layer 162, a protection layer 163, and a blocking layer 164.

The heat-radiating adhesive layer 161 may be disposed between the buffer sheet 120 and the graphite layer 162. The heat-radiating adhesive layer 161 may attach the graphite layer 162 and the buffer sheet 120 to each other. In an exemplary embodiment, the heat-radiating adhesive layer 161 may include an optical polymer film (OCA) and/or an optical transparent adhesive resin (OCR).

The graphite layer 162 may be disposed between the heat-radiating adhesive layer 161 and the protection layer 163. The graphite layer 162 contains graphite molecules. The graphite layer 162 has higher thermal conductivity in the horizontal direction than thermal conductivity in the vertical direction.

The protection layer 163 may be disposed on the graphite layer 162. The protection layer 163 can prevent the graphite molecules of the graphite layer 162 from scattering (or can reduce a likelihood or amount of such scattering). The protection layer 163 may contain polyethylene terephthalate (PET).

The heat dissipation sheet 160 may further include one heat-radiating adhesive layer. In an exemplary embodiment, the heat-radiating adhesive layer may be disposed on the protection layer 163. Accordingly the graphite layer 162 and the protection layer 163 may be disposed between the heat-radiating adhesive layer 161 and the heat-radiating adhesive layer. In another exemplary embodiment, the heat-radiating adhesive layer may be disposed on the graphite layer 162. In this case, the protection layer may be omitted.

The blocking layer 164 may be disposed on the buffer sheet 120. The blocking layer 164 may be disposed at both sides of the heat-radiating adhesive layer 161, the graphite layer 162, and the protection layer 163. For example, the blocking layer 164 may be formed to cover the heat-radiating adhesive layer 161, the graphite layer 162, and the protection layer 163 on a plane. In some embodiments, the blocking layer 164 may seal the heat-radiating adhesive layer 161, the graphite layer 162, and the protection layer 163. The blocking layer 164 may contain polyethylene terephthalate (PET).

The heat dissipation sheet 160 has a smaller area (a smaller total area) than the buffer sheet 120 on a plane (e.g., in a plane substantially parallel to the buffer sheet 120). Accordingly, the buffer sheet 120 includes a region not overlapping the heat dissipation sheet 160 on a plane (e.g., in a plane substantially parallel to the buffer sheet 120).

Figure 23:
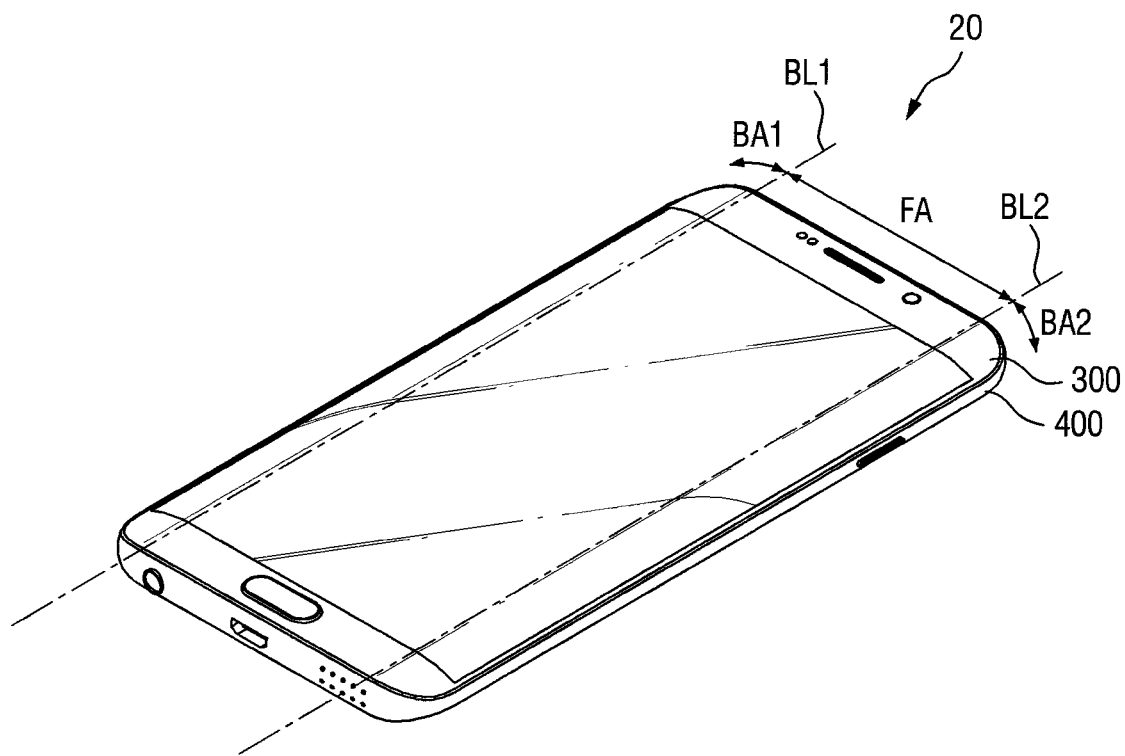
FIG. 23 is a perspective view showing another example of a display device to which the composite sheet according to an embodiment of the present disclosure is applied.
Figure 24:
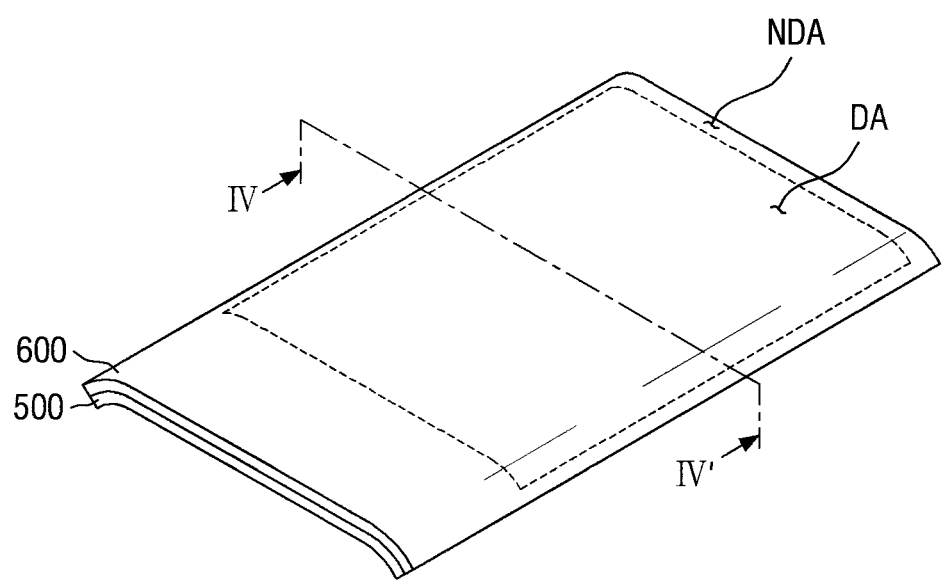
FIG. 24 is a perspective view showing an example of the composite sheet and display panel shown in FIG. 23.
Figure 25:
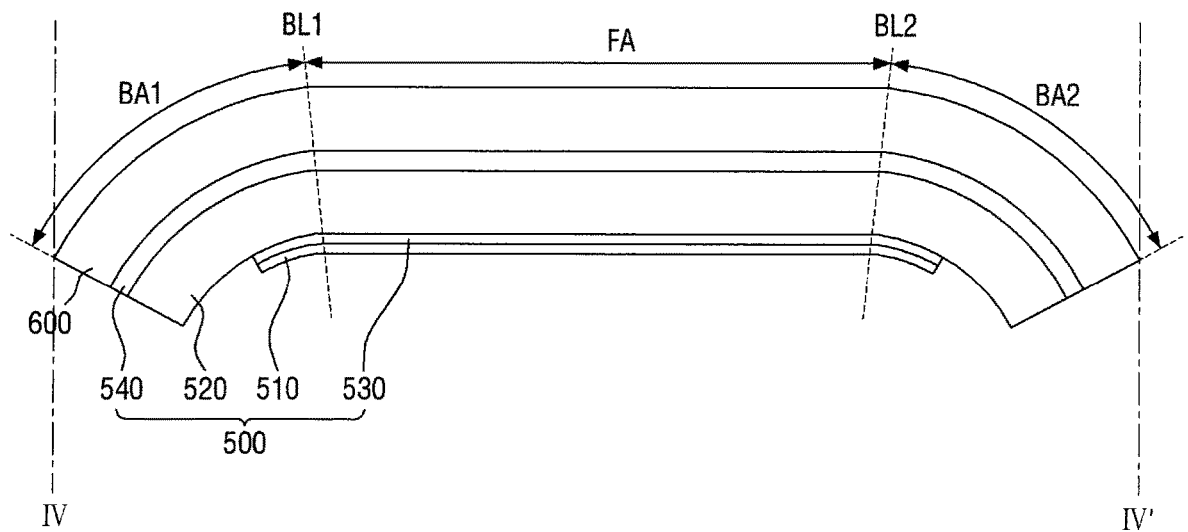
FIG. 25 is a cross-sectional view taken along the line Iv-IV of FIG. 24.
Figure 26:
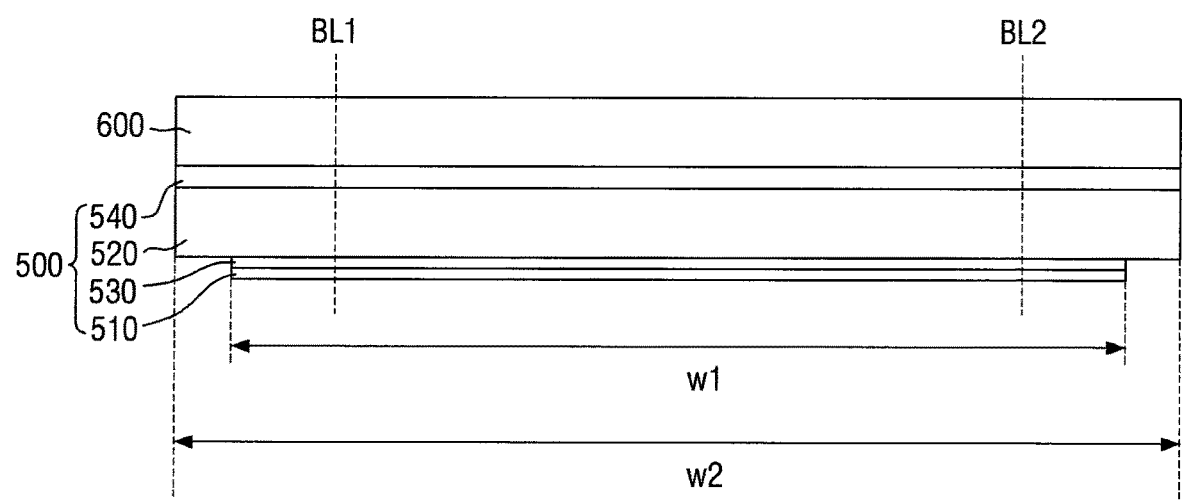
FIG. 26 is a cross-sectional view taken along the line Iv-IV of FIG. 24 without bending.

FIG. 23 is a perspective view showing another example of a display device to which the composite sheet according to an embodiment of the present disclosure is applied. FIG. 24 is a perspective view showing an example of the composite sheet and display panel shown in FIG. 23. FIG. 25 is a cross-sectional view taken along the line Iv-IV of FIG. 24. FIG. 26 is a cross-sectional view taken along the line Iv-IV of FIG. 24 without bending. A description of features that are the same or substantially the same as features described with respect to FIGS. 15-22 is not necessary here.

The display device 20 according to another embodiment of the present disclosure includes a region, at least a portion (e.g., a part) thereof being bent. For example, the display device 20 may include a flat portion FA, a first bent portion BA1, and a second bent portion BA2.

The flat portion FA may be disposed between the first bent portion BA1 and the second bent portion BA2. The first bent portion BA1 is connected to one side of the flat portion FA, and may be bent at a set (e.g., predetermined) angle with respect to the first bending line BL1. The second bending portion BA2 is connected to the other side of the flat portion FA opposite to one side thereof, and may be bent at a set (e.g., predetermined) angle with respect to the second bending line BL2. In an exemplary embodiment, the first bent portion BA1 may be parallel (e.g., substantially parallel) to the second bent portion BA2. Meanwhile, unlike what is shown in FIG. 23, the display device 20 may also include only one of the first bent portion BA1 and the second bent portion BA2.

The display device 20 may include a composite sheet 500 and a display panel 600.

In an exemplary embodiment, the display panel 600 may be an OLED panel. The display panel 600 includes a display area DA and a non-display area NDA. The display area DA may be defined as an area for displaying an image. The non-display area NDA is located at the outer periphery of the display area DA and may be defined as an area surrounding the display area DA. The display panel 600 may include regions bent along the respective first bending line BL1 and second bending line BL2.

The composite sheet 500 may be combined with the display panel 600. The composite sheet 500 may include a heat dissipation sheet 510 and a buffer sheet 520. In some embodiments, the heat dissipation sheet 510 is disposed on the buffer sheet 520. Accordingly, the buffer sheet 520 may be disposed between the heat dissipation sheet 510 and the display panel 600. The length w2 of the short side of the buffer sheet 520 is longer than the length w1 of the short side of the heat dissipation sheet 510. The composite sheet 500 may include regions bent along the respective first bending line BL1 and second bending line BL2. In some embodiments, each of the heat dissipation sheet 510 and the buffer sheet 520 may include regions bent along the respective first bending line BL1 and second bending line BL2.

Unlike what is shown in the drawings, the length w1 of the short side of the heat dissipation sheet 510 may be shorter than the distance between the first bending line BL1 and the second bending line BL2. In this case, only the buffer sheet 520 includes regions bent along the respective first bending line BL1 and second bending line BL2, and the heat dissipation sheet 510 does not include the bent regions.

Further, although not shown in FIG. 25, the length of the long side of the heat dissipation sheet 510 may be shorter than the length of the long side of the buffer sheet 520. In some embodiments, the sizes of the heat dissipation sheet 510 and the buffer sheet 520 are not particularly limited as long as the heat dissipation sheet 510 includes a region exposed to the outside without overlapping the buffer sheet 520.

The composite sheet 500 may further include an adhesive layer 530 and a light-blocking sheet 540. The adhesive layer 530 may have the same or substantially the same short side length as the heat dissipation sheet 510. The light-blocking sheet 540 may have the same or substantially the same short side length as the buffer sheet 520.

As described above, in the composite sheet, method of fabricating the composite sheet and display device including the composite sheet according to the embodiments of the present disclosure, it is possible to alleviate the occurrence of wrinkles in the heat dissipation sheet due to plastic deformation by forming the buffer sheet after forming the heat dissipation sheet.

Although embodiments of the present disclosure have been disclosed for illustrative purposes, those skilled in the art will appreciate that various modifications, additions and substitutions are possible, without departing from the scope and spirit of the present disclosure as defined in the appended claims, and equivalents thereof.

What is claimed is:

1. A display device, comprising:
   a display panel; a buffer layer on one surface of the display panel;
   a heat dissipation layer on one surface of the buffer layer;
   a radiation member on the heat dissipation layer; and
   an adhesive layer between the heat dissipation layer and the buffer layer,
   wherein one surface of the heat dissipation layer facing the one surface of the buffer layer has a smaller area than the one surface of the buffer layer, and
   wherein the buffer layer is between the display panel and the heat dissipation layer.

2. The display device of claim 1,
   wherein the radiation member overlaps the heat dissipation layer.

3. The display device of claim 2,
   wherein the heat dissipation layer comprises a first short side and a first long side longer than the first short side, and the radiation member comprises a second short side and a second long side longer than the second short side.

4. The display device of claim 3,
   wherein a length of the first long side is equal to a length of the second long side.

5. A display device, comprising:
   a display panel;
   a buffer layer on one surface of the display panel;
   a heat dissipation layer on one surface of the buffer layer; and
   a radiation member on the heat dissipation layer,
   wherein one surface of the heat dissipation layer facing the one surface of the buffer layer has a smaller area than the one surface of the buffer layer,
   wherein the radiation member overlaps the heat dissipation layer, and
   wherein one surface of the radiation member has a smaller area than the one surface of the heat dissipation layer.

6. The display device of claim 5,
   wherein the radiation member exposes at least a portion of the heat dissipation layer.

7. The display device of claim 1,
   wherein the radiation member includes a conductive layer.

8. The display device of claim 7,
   wherein the conductive layer includes copper, nickel, or ferrite.

9. The display device of claim 1,
   wherein the radiation member blocks electromagnetic interference.

10. The display device of claim 1, further comprising:
    an adhesive layer disposed between the heat dissipation layer and the buffer layer.

11. The display device of claim 1,
    wherein the buffer layer includes an elastic polymer resin.

12. The display device of claim 11,
    wherein the elastic polymer resin includes polyethylene, polycarbonate, polyurethane, or polypropylene.

\* \* \* \* \*